United States Patent
Goodsell

(10) Patent No.: US 9,629,269 B2
(45) Date of Patent: Apr. 18, 2017

(54) ELECTRICAL WIRING DEVICE AND METHOD FOR PROVIDING REPLACEMENT INSTRUCTIONS

(71) Applicant: HUBBELL INCORPORATED, Shelton, CT (US)

(72) Inventor: John P. Goodsell, Stratford, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 14/469,057

(22) Filed: Aug. 26, 2014

(65) Prior Publication Data

US 2015/0060133 A1 Mar. 5, 2015

Related U.S. Application Data

(60) Provisional application No. 61/872,249, filed on Aug. 30, 2013.

(51) Int. Cl.
 *H05K 5/02* (2006.01)
(52) U.S. Cl.
 CPC ............ *H05K 5/0252* (2013.01); *Y10T 29/49* (2015.01)
(58) Field of Classification Search
 CPC ...................................... H05K 5/252
 USPC .......................................... 174/520
 See application file for complete search history.

(56) References Cited

U.S. PATENT DOCUMENTS

| 5,284,363 | A  | * | 2/1994  | Gartner et al. ................ 283/81 |
| 7,823,342 | B1 | * | 11/2010 | Van Horn Steel et al. . 52/127.8 |
| 2002/0154488 | A1 | * | 10/2002 | Leopold et al. ............. 361/728 |
| 2008/0098637 | A1 | * | 5/2008  | Pratt ............................. 40/673 |

OTHER PUBLICATIONS

Mr Palitoy's Cardback Guide [retrieved on Jun. 1, 2015]. Retrieved from the Internet: <http://www.freewebs.com/mrpalitoy/sw2Ocardback.htm>.*
Rediscoverd Shooting Treasures [retrieved on Jun. 9, 2015]. Retrieved from the Internet: <http://www.rediscoverd-shooting-treasures.com/savhangtagorder.htm.*

* cited by examiner

*Primary Examiner* — Hoa C Nguyen
*Assistant Examiner* — Stanley Tso
(74) *Attorney, Agent, or Firm* — Dickinson Wright PLLC

(57) ABSTRACT

An eletrical wiring device includes a housing having a front outer surface is visible during use and in an installed position, a side surface and a rear surface. Printed indicia is provided on the side surface of the housing or a front surface of the housing for identifying the location of compliance installation instructions for installing the electrical wiring device in a wiring system. The printed indicia is oriented to be visible by the installer during installation of the electrical wiring device and is oriented to be covered by a faceplate after installation of the electrical wiring device. Printed compliance installation instruction indicia is provided on the housing for installing the electrical wiring device in the electrical system. The compliance installation instruction indicia is oriented to be visible by the installer during installation of the electrical wiring device in the electrical system.

10 Claims, 5 Drawing Sheets

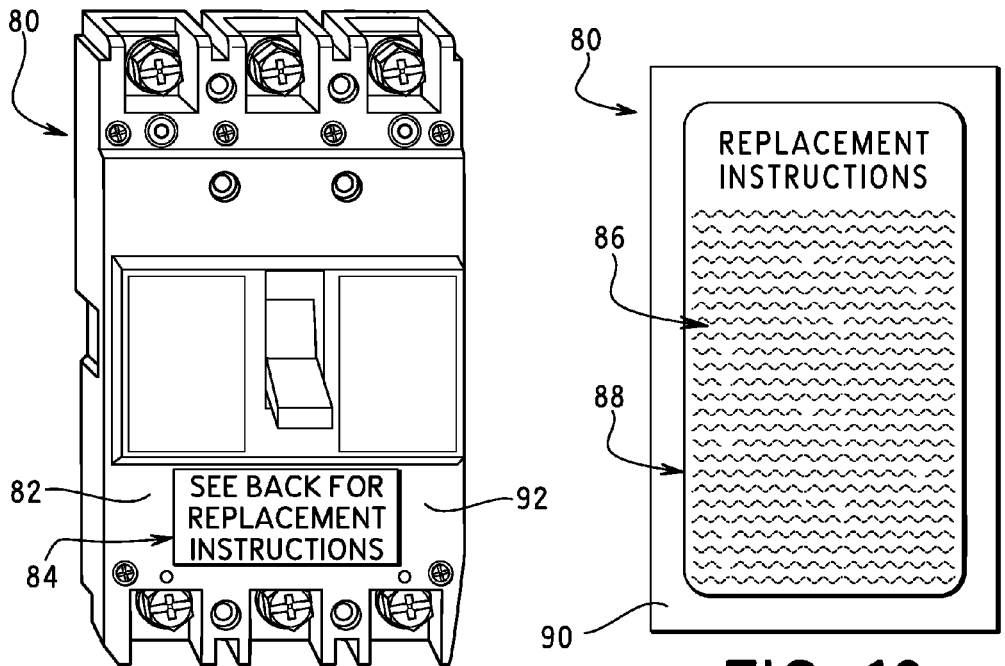
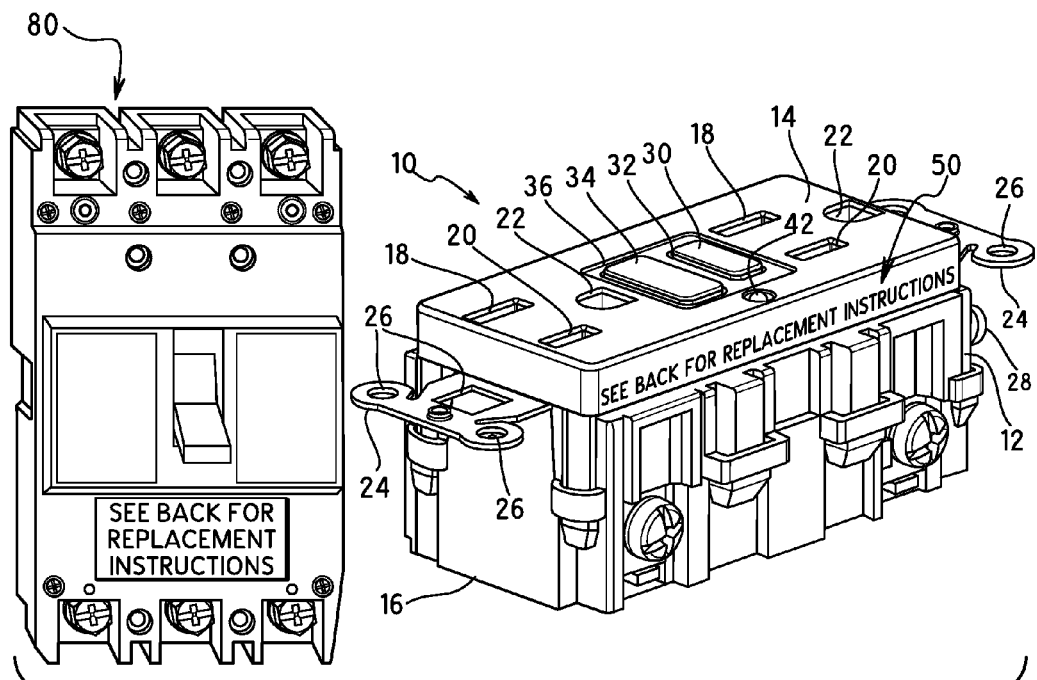

ELECTRICAL WIRING DEVICE AND METHOD FOR PROVIDING REPLACEMENT INSTRUCTIONS

CROSS-REFERENCE TO RELATED APPLICATION

This application claims priority to U.S. Provisional Application No. 61/872,249, filed Aug. 30, 2013, which is hereby incorporated by reference in its entirety.

FIELD OF THE INVENTION

The present invention is directed to an electrical wiring device such as an electrical receptacle. The invention is further directed to an outlet branch circuit arc-fault circuit interrupter, a ground fault circuit interrupter, molded case circuit breaker and kits having a combination of an outlet branch circuit arc fault circuit interrupter and a molded case circuit breaker. The invention is also directed to an electrical receptacle having installation instructions or installation notices and information on or attached to the electrical wiring device that is visible by the installer during installation.

BACKGROUND OF THE INVENTION

Various building and electrical codes require that certain notifications or instructions be provided with the electrical device or displayed prominently on the receptacle that can easily read and understood by the installer. The limited surface area available on the receptacle can make it difficult to provide the necessary information in a print size that can be read by the installer.

Electrical devices, such as arc fault interrupters, ground fault interrupter, circuit breakers and arc fault circuit breakers are required to provide certain information pertaining to the instruction and replacement of the electrical device on or with the device that is accessible to the installer to inform the installer of the installation requirements. Typically the installation instructions and the notice of code requirements are provided on instruction sheets enclosed with the device or printed on the packaging for the device.

The prior devices and methods of providing instructions, information and notice are generally suitable for the intended purpose but do not enable the instructions to be fixed to the device.

SUMMARY OF THE INVENTION

The present invention is directed to a marking or labeling system for an electrical device and to a method that enables the required information be prominently displayed in a legible form on the electrical device.

The invention is further directed to an electrical wiring device having indicia provided on the electrical wiring device in a location that is readily visible to the electrician or installer during installation of the device. The indicia provided in a prominent location display the installation instructions and information or direct the installer to a location on the device or packaging associated with the device for proper installation procedures, notice or other information. Examples of electrical wiring devices include duplex receptacles, surge receptacles, dimmer switches, and switches including 3-way and 4-way switches.

One aspect of the invention is directed to arc-fault interrupter circuit breakers and arc-fault circuit interrupter receptacles commonly referred to as outlet branch circuit arc-fault circuit interrupters. Electrical codes or product standards often require that the arc-fault circuit interrupter be marked in a location that is visible during replacement of the circuit breaker. The markings must be provided on the surface of a molded case circuit breaker. The present invention also provides a method and label for providing instructions and notices on electrical wiring devices where the surface area of the device is limited. In the embodiments shown in the attached drawings, the markings can be formed directly on the housing or on a label or tag attached to the electrical wiring device.

The electrical wiring device of the invention in one embodiment has indicia on the front surface or side surface of the body or housing of the electrical wiring device. The indicia is visible to the installer for providing pertinent information for the installation of the electrical wiring device. The indicia providing the information can be a visible location to direct the user to another location on the electrical wiring device for additional instruction, notice, or information for use or installation of the electrical wiring device. The indicia can be visible by the installer with a cover plate removed that is normally present during use of the electrical wiring device. The indicia is located on a surface of the electrical wiring device in a location that is readily visible to the installer.

The electrical wiring device of the invention has indicia on or attached to a surface of the electrical wiring device providing instruction indicia such as a notice regarding the proper use and installation of the electrical wiring device in an electrical system or wiring assembly or replacement of an existing electrical wiring device. The instruction indicia can be placed on a side surface or on a rear surface of the housing. The indicia can be provided directly on the surface of the housing or on a printed tag or label that can be permanently fixed to the housing or can be removable.

One feature of the invention is to provide installation instructions, notice, or information on a rear surface of the electrical wiring device. A printed label having suitable indicia corresponding to the instructions, notice or information is attached to the rear surface. In one embodiment, the label can be at least two sheets overlying each other and attached by a pressure sensitive adhesive such that a top sheet can be peeled to expose all or part of the indicia on the underlying sheet. The label or sheets can be permanently fixed to the surface of the electrical wiring device or can be attached by a pressure sensitive adhesive to be removable.

Another feature of the invention is to provide an electrical wiring device with a tag or label that is removable from the electrical wiring device before or after installation of the electrical wiring device. The electrical wiring device can have indicia on a front surface or a side surface that is visible to the installer during installation of the electrical wiring device to direct the attention of the installer to the tag or label for additional notices, instructions and information for installing the electrical wiring device or replacing an existing electrical wiring device.

The various features of the invention are basically attained by providing an electrical wiring device comprising a housing having a front surface that is visible during use in an installed position, a side surface and a rear surface with printed indicia and installation instructions. The indicia is provided on the front surface or the side surface of the housing identifying a second location on the housing of installation instruction indicia for installing the electrical wiring device. The installation instruction indicia is provided on the housing for installing the electrical wiring device in an electrical wiring system.

The features of the invention are further attained by providing an electrical wiring device comprising a housing having a front outer surface visible during use in an installed position, a side surface, and a rear surface. Printed indicia on the side surface of the housing is provided to identify the location of installation instructions for installing the electrical wiring device to a wiring system. The printed indicia is oriented to be visible during installation of the electrical wiring device and covered by a faceplate after installation. Printed installation instruction and notice indicia is provided on the housing for installing and proper use of the electrical wiring device in an electrical system. The installation instruction indicia is oriented to be visible by the installer during installation of the electrical wiring device in the electrical system.

The features of the invention are also provided by a method of providing printed instruction or notice indicia on an electrical wiring device comprising the steps of providing an electrical wiring device having a housing with a front outer surface that is visible during use in an installed position, a side surface, and a rear surface. Forming indicia on the housing in a location that is visible to an installer during installation of the electrical wiring device where the indicia directs the installer to compliance installation instruction or notices indicia on the housing. The method further provides the compliance installation instruction or notice indicia on the housing for installing the electrical wiring device in an electrical system.

These and other features of the invention will become apparent from the following detailed description of the invention, which in conjunction with the annexed drawings disclose various embodiments of the invention.

BRIEF DESCRIPTION OF THE DRAWINGS

The following is a brief description of the drawings in which:

FIG. 9 is a front perspective view of molded case circuit interrupter;

FIG. 10 is a bottom view of the molded case circuit interrupter of FIG. 9; and FIG. 11 is front view showing the combination of a molded case circuit interrupter and an arc-fault circuit interrupter.

DESCRIPTION OF THE INVENTION

Figure 1:
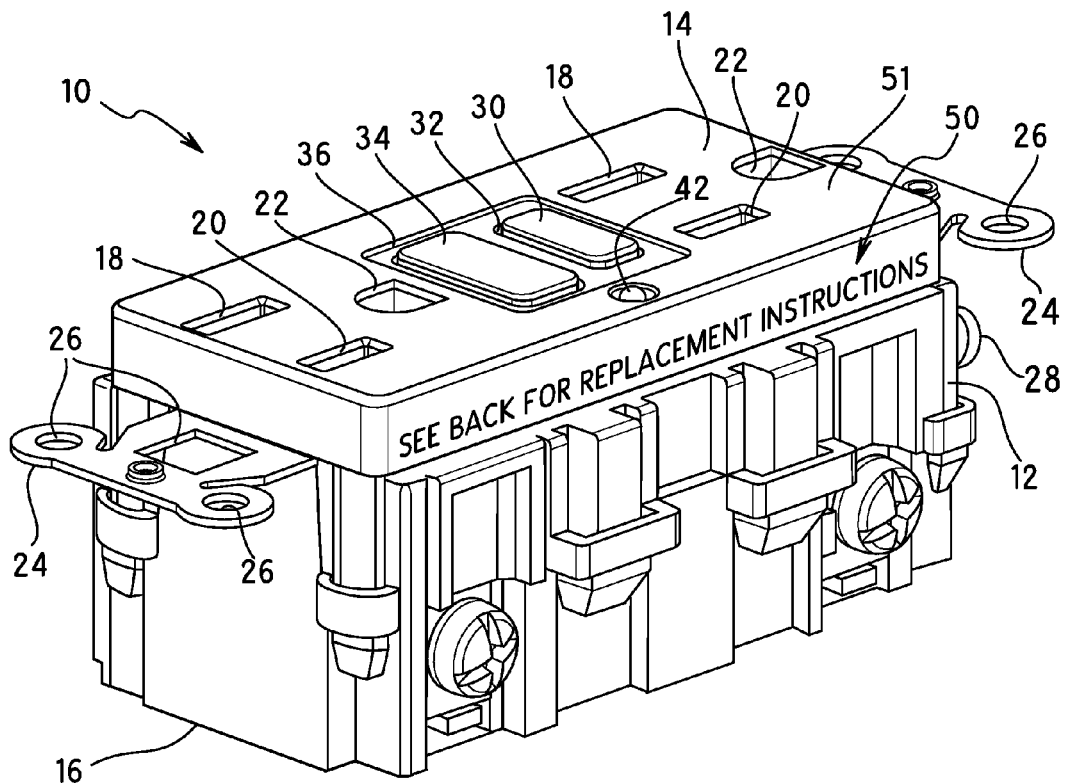
FIG. 1 is a top perspective view of an arc-fault circuit interrupter outlet showing the indicia markings on the side of the housing.

The present invention is directed to electrical wiring devices, such as an electrical receptacle, with specialized or specific instructions for installing or replacing the electrical device in an electrical wiring system or assembly. The invention is further directed to method for marking an electrical wiring device with indicia directing the installer to a location on the electrical wiring device for written notice, information and/or instructions for installing and proper use of the electrical wiring device or replacing an electrical wiring device.

The invention is particularly directed to an electrical wiring device having notices and information directly on the electrical wiring device for the installation or replacement of the electrical wiring device. The electrical wiring device in the embodiment shown and described herein include an outlet branch circuit arc-fault circuit interrupter, a molded case circuit breaker, kits or combinations of an outlet branch circuit arc-fault interrupter and a molded case circuit breaker. The electrical wiring device can also be a ground fault or arc fault circuit interrupter as known in the art. In other embodiments, the electrical wiring device is a surge receptacle, a dimmer switch, or a switch such as a 3-way or 4-way switch.

Building codes, electrical codes, and product standards require certain information and notices pertaining to the installation and use of the electrical wiring device be provided on or with the electrical wiring device. Certain notices relating to the use and installation of some electrical devices are required to have specific notices and information on the electrical device in a location that is visible and accessible to the installer during the installation.

The limited surface area and space available on electrical receptacles and other electrical wiring devices make it difficult to provide the necessary instructions, information or notices in a manner that the instructions, information and notices are legible and easily seen and read by the installer during the installation. The invention provides an arrangement for directing the installer to the location of the instructions, notice or information on the electrical wiring device and provides the instructions, notice or information to the installer during installation of the electrical wiring device to comply with the notice and labeling requirements for the electrical wiring device.

Instructions and indicia according to the present invention can be printed or engraved directly on the electrical wiring device, provided on a label that is attached to a surface of the electrical wiring device, or provided on a tag that is attached to the electrical wiring device. The instruction, notice or information indicia can be permanently fixed to a surface of the electrical wiring device or attached by an adhesive, such as a pressure sensitive adhesive, so that the instruction indicia can be removed before or after installation of the electrical wiring device.

The instructions and indicia can provide information for the correct installation and use of the electrical wiring device. The instruction can be a wiring diagram. In one embodiment, the electrical wiring device is a dimmer switch, a 3-way switch or a 4-way switch where the instructions and indicia provide a wiring diagram to assist in installing the device in the wiring system or to identify types of loads, or multi gang installations.

Electrical wiring devices are required to comply with building codes and are required to include installation instructions for proper installation of the particular electrical wiring device. The outlet branch circuit arc-fault circuit interrupter outlet receptacles must have the marking in a location visible with the cover plate removed. Under the current product standard requirements UL 1699C, a molded case circuit breaker, and an outlet branch circuit arc-fault circuit interrupter and kits containing a combination of the devices are to be labeled "CAUTION—System combination AFCI—For continued arc fault protection, both the OBC AFCI receptacle and branch circuit breaker must be replaced together if it becomes necessary to replace either component". The present invention provides an arrangement for indicia on the electrical wiring device that is able to present the instructions, notices and/or information that would otherwise not be visible or legible to the installer during use and installation of the electrical wiring device.

FIG. 1 is a perspective view of one example of the invention showing a duplex receptacle such as an outlet branch circuit arc-fault circuit interrupter (OBC AFCI) or ground fault circuit interrupting (GFCI) device 10 in accordance with an embodiment of the present invention. The receptacle 10 comprises a housing 12 defining a body having a cover portion 14 and a rear body portion 16. The receptacle 10 also includes an inner housing when the cover portion 14 is removed from the rear body portion 16. The cover portion 14 and rear body portion 16 are removably secured to each other by fastening such as clips, screws, brackets, tabs and the like. The cover portion 14 includes slots 18 and 20 and grounding slots 22 for receiving the blades of a plug. The slots 18 and 20 and grounding slots 22 can accommodate polarized, non-polarized, grounded or non-grounded blades of a two wire or three wire plug. The receptacle 10 further includes mounting strap 24 having mounting holes 26 for mounting the receptacle 10 to a junction box as known in the art. The rear wall of the housing 12 includes a grounding screw 28 for connecting a ground conductor.

A test button 30 extends through an opening 32 in the cover portion 14 of the housing 12. The test button is used to activate a test operation that tests the operation of the outlet branch circuit arc-fault interrupter receptacle device 10. The circuit interrupting components of an arc-fault interrupter breaks electrical continuity in one of the conductive paths between the line and load side of the outlet branch circuit arc-fault interrupter 10. A reset button 34 extends through opening 36 in the cover portion 14 of the housing 12 to activate a reset operation, which reestablishes electrical continuity in the open conductive paths. A test light 42 is provided to signal the proper operation of the device. The electrical components of the arc-fault circuit interrupter are standard components as known in the art.

As shown in FIG. 1, the side wall of the cover 14 has a side surface with indicia or markings 50 relating to the installation, use and replacement of the outlet branch circuit arc-fault interrupter. In one embodiment, the indicia 50 identify the location of the full and complete instructions, notice or information for installing, use and replacement of the device according to code requirements, product standards, or manufacturer requirements. The indicia 50 in this embodiment is provided in one location readily visible to the installer to direct the installer to another location on the housing 12 of the device 10 for additional information relating to the use, installation or replacement of the device. The indicia can be printed words, pictures or illustrations.

The indicia 50 are provided on a surface that is visible to the installer during installation of the device. In the embodiment shown, the indicia 50 is formed on a side surface below and next to the front face 51 of the device so that the indicia 50 is easily visible and legible to the installer during installation. In this embodiment, the indicia 50 is in a location spaced from the front face 51 a distance so that the indicia can be covered by a face plate or cover plate commonly attached to the device after installation but is visible when the cover plate is removed.

In the embodiment shown, the indicia 50 or markings are fixed on a side surface of the cover 14 and the housing 12 to direct the installer to "See Back for Replacement Instruction", thereby directing the installer to another or different location on the housing 12. Other suitable markings or printing also can be provided to direct the installer to the location of the instructions and notices. The indicia 50 can be printed, molded, engraved, or embossed on the surface of the device in a manner to be legible by the installer. The indicia 50 can also be a printed label. Preferably, the indicia 50 has a print size that is legible by the installer to enable the installer to quickly and easily identify the other location on the housing to locate the complete instructions, notice or information needed by the installer.

Figure 2:
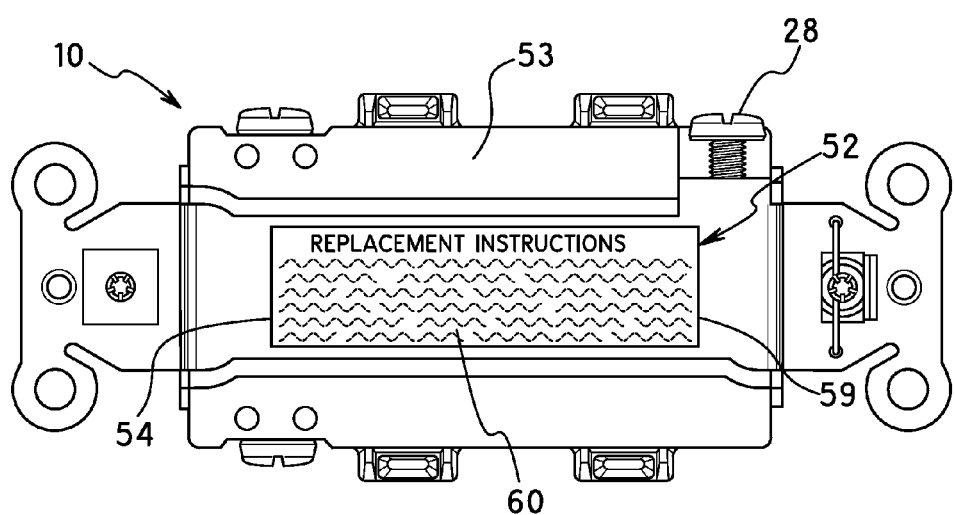
FIG. 2 is bottom view of the outlet of FIG. 1 showing the indicia markings on a label attached to the bottom face.

Referring to FIG. 2, the instructions, notice or information indicia 60 for installing the device and/or replacing an existing device are attached to the rear side 53 of the device 10 in a form that is legible and provides the complete instructions, notice or information necessary for proper installation and compliance with code requirements or replacement of the device. The instruction, notice or information, in the embodiment shown, is a label 52 having one or more sheets attached to the rear surface by a suitable adhesive. Alternatively, the instruction, notice or information can be printed directly on the surface of the device 10 when the surface area is sufficient to allow a legible print size. The label can permanently fixed to the device or removable. In one embodiment, the indicia 60 provides a notice of proper use and includes the notice "CAUTION—System combination AFCI—for continued arc fault protection, both OBC AFCI receptacle and branch circuit breaker must be replaced together if it becomes necessary to replace either component."

Figure 3:
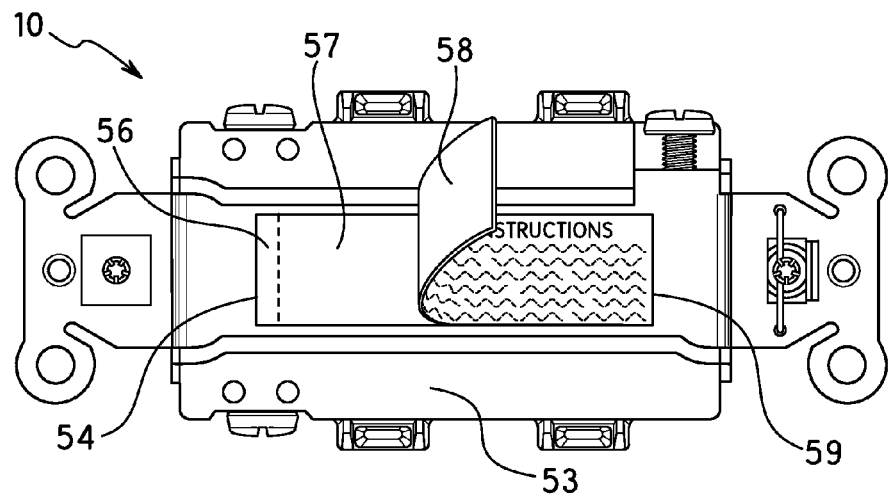
FIG. 3 is a bottom view showing the label partially opened for displaying the full information indicia.
Figure 4:
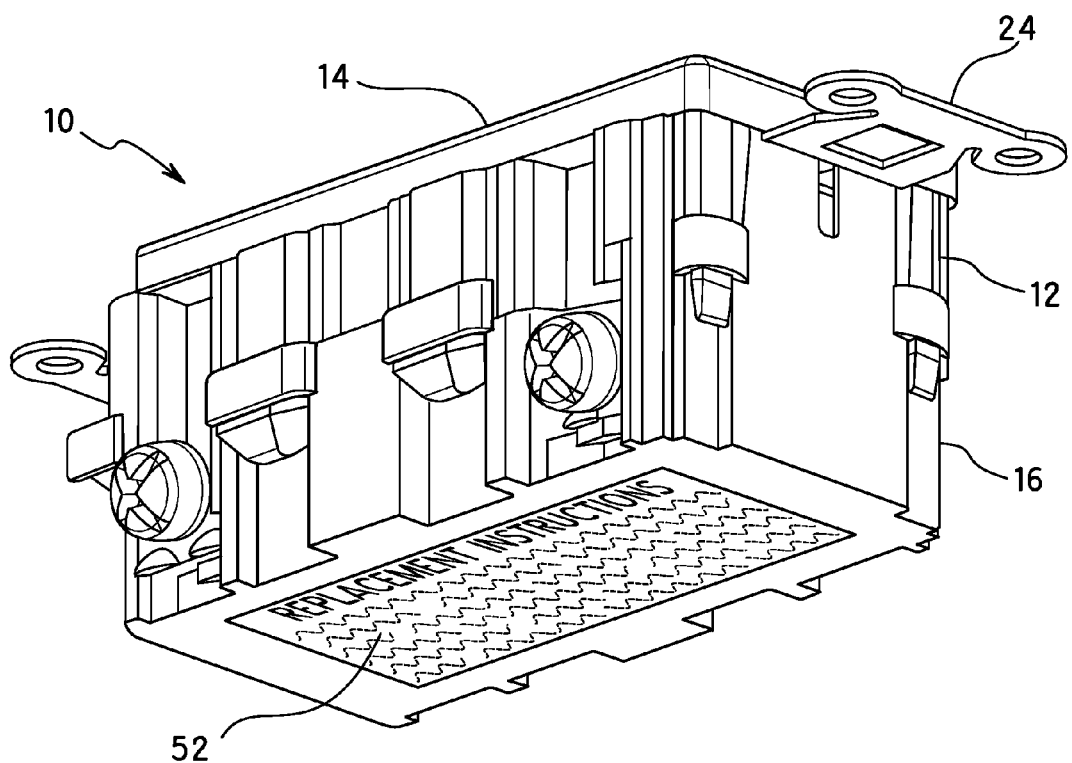
FIG. 4 is bottom perspective view of the arc-fault circuit interrupter outlet showing the instruction sheet adhered to the rear surface.

The label 52 in the embodiment shown can include multiple sheets or pages that are folded to a closed position shown in FIG. 3. The multiple sheets lie flat against the surface of the device 10 in a manner that does not interfere with the use and installation of the device. The sheets can be laminated with one or more peel layers or sheets that can be separated from each other. In this embodiment, one side edge 54 of the label 52 includes a pressure sensitive adhesive 56 between a base sheet 57 and a top cover sheet 58 that allows the sheets to be opened as shown in FIG. 3 to provide additional surface area for the necessary instruction, notice, or information in a manner that is complete and easy to read. The top sheet 58 is connected to the base sheet 57 at a second edge 59 and can be opened to display the full text of the printed information indicia 60 that extends across the surfaces of the sheets. The top sheet 58 can then be closed and reattached to the base sheet 57 by the pressure sensitive adhesive 56 on the outer surface of the base sheet 57 that is attached to the rear surface 53 of the electrical wiring device 10 by an adhesive or other method. In another embodiment, the instruction, notice, or information indicia can be printed, engraved or embossed directly on the rear surface of the receptacle as shown in FIG. 4.

The indicia 60 in the embodiment shown is printed words providing instruction for the installation or replacement of the electrical wiring device. In other embodiments, the indicia 60 can be pictures, illustrations or optical machine readable representation of data. The optical machine readable representation can be one dimensional or two dimensional. In other embodiments, the indicia 60 can be a bar code or a quick reference (QR) block or code, such as a one-dimensional or two-dimensional bar code, to enable the installer to locate and download the instructions.

Figure 5:
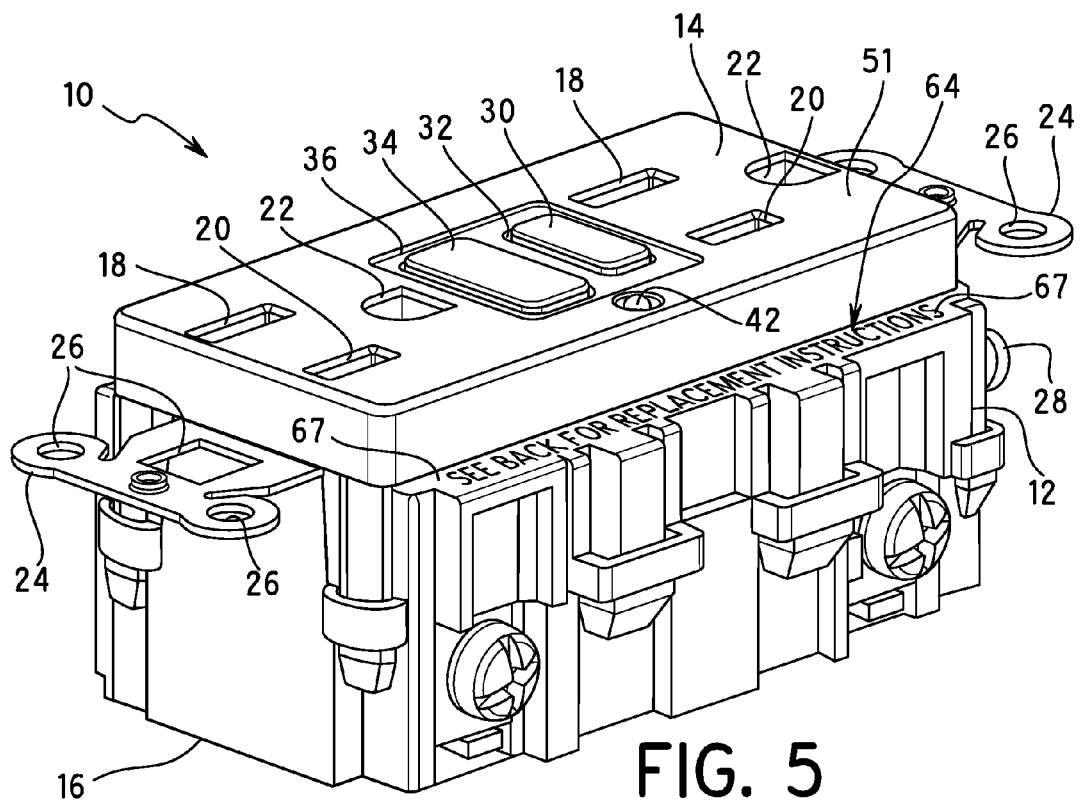
FIG. 5 is a perspective view of the arc-fault circuit interrupter outlet in a second embodiment showing the markings of the top face of a ledge of the housing.
Figure 6:
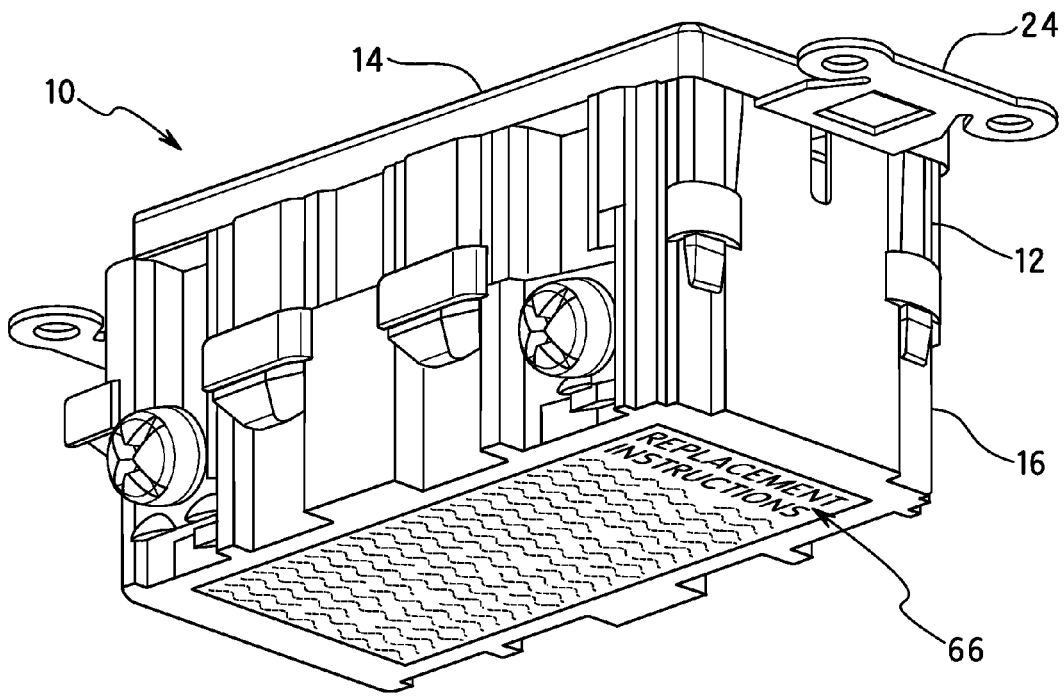
FIG. 6 is a bottom perspective view showing the markings on the bottom surface of the outlet.

In a second embodiment shown in FIG. 5, the electrical receptacle 10 is similar to the embodiment of FIG. 1 so that the same elements are identified by the reference number. The electrical receptacle has a ledge or shoulder 67 on the housing adjacent the cover 14 that receives the face plate in the finished and assembled device. The shoulder 67 faces outwardly with respect to the front face 51 of the housing 12. In this embodiment, printed indicia 64 is provided on the shoulder 67 that faces outwardly with respect to the front face of the device. As in the previous embodiment, the indicia are visible to the installer during installation and covered by the face plate after installation of the device.

The indicia on the shoulder instruct the installer of the location of the complete instructions, notice, or information indicia 66 for correct use and installation of the device. The location of the instruction indicia 66 is different from the location of the indicia 64 for directing the user to the location of the instruction indicia 66. The indicia 66 can be a label attached to a suitable surface on the device 10.

Figure 7:
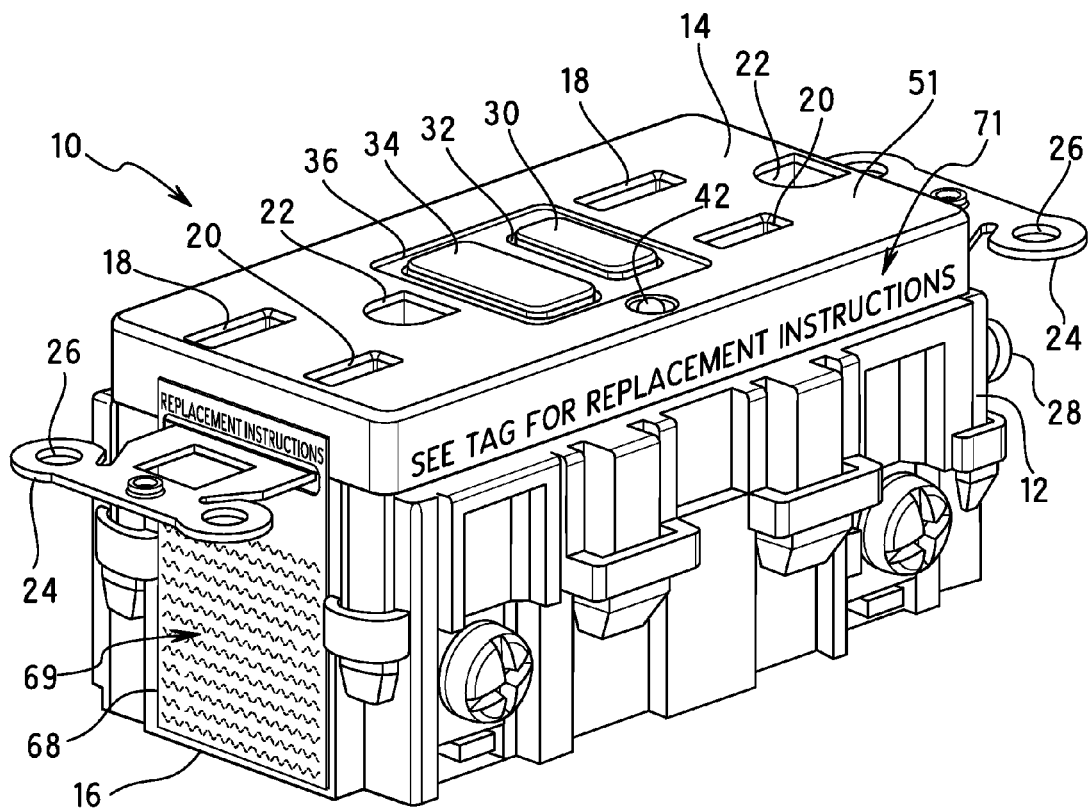
FIG. 7 is a perspective view showing the arc-fault circuit interrupter outlet having a tag attached to the outlet.
Figure 8:
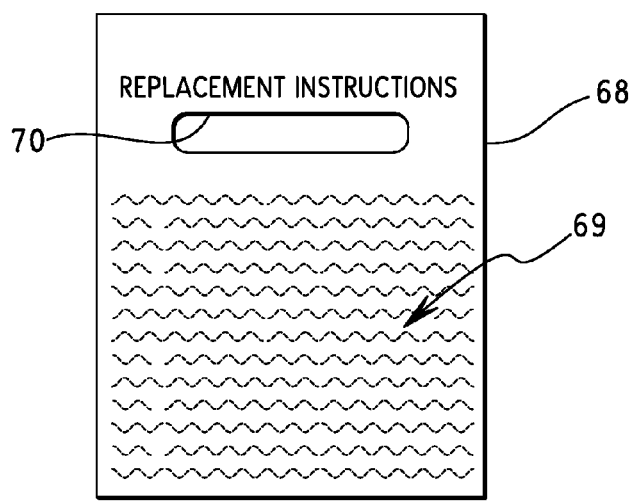
FIG. 8 is an elevational view of the tag of FIG. 7.

In another embodiment of the invention, the instructions, notice, or information indicia 69 is provided on a tag, such as a hang tag 68, that is attached to the electrical wiring device 10 as shown in FIG. 7. The electrical wiring device 10 is substantially the same as in FIG. 1 so that the elements are identified by the same reference number. The tag 68 in the embodiment shown in FIG. 8 includes an aperture 70 for receiving the mounting tab 24 of the electrical wiring device so that the tag 68 is attached directly to the receptacle in a manner that is visible and legible by the installer. Alternatively, the tag can be attached to the end wall or other surface of the receptacle by an adhesive. As in the previous embodiment, the tag 68 can be a single sheet or multiple sheets that form a peel layer that can be separated to view the printed installation indicia 69. In this embodiment, the hang tag 68 can be removed from the electrical wiring device so that the installer can read the information provided during use and installation of the electrical wiring device. In a manner similar to the previous embodiments, the side surface of the housing 12 includes indicia 71 for directing the installer to the tag 68 and/or the location of the installation instruction indicia 69.

In another embodiment of the invention shown in FIGS. 9 and 10, the electrical wiring device is a molded case circuit breaker 80 as known in the art. In this embodiment, the molded case circuit breaker 80 has a front surface 82 with indicia 84 directing the installer to the location of the installation, notice, or information instruction indicia 86 in a manner similar to the previous embodiments. In the embodiment shown, the instruction indicia 86 are in the form of a printed label 88 that is attached to the rear surface 90 of the housing of the circuit breaker 80. The printed label 88 can be a single sheet or multiple sheets as in the previous embodiment. The indicia 84 is provided on a front surface 92 of the circuit breaker 80 to be visible during installation.

The molded case circuit breaker 80 and the outlet branch arc-fault circuit interrupter 10 can be provided in combination as a kit 94 or assembly as shown in FIG. 11. As in the previous embodiments, each of the molded case circuit breaker 80 and the outlet branch arc-fault circuit interrupter 10 include the indicia on the front or side surface of the respective device in manner that the indicia is visible during installation or use for directing the installer to the location of the compete instruction, notice or information needed to properly install or replace the electrical wiring devices in a wiring assembly.

The method of marking the electrical device with suitable instructions or notices is shown in connection with the electrical wiring device. The markings and tags of the invention as described herein are suitable for use in various electrical wiring devices such as for example outlet branch arc fault circuit interrupter, molded case circuit breakers and kits including a combination of the electrical wiring devices.

The method includes the step of providing an electrical wiring device having a front outer surface, that is visible during use in an installed position, a side surface, and a rear surface. Indicia is provided on the housing in a first location that is visible to the installer during installation of the electrical wiring device, where the indicia directs the installer to a second location on the housing for compliance installation instruction indicia. The compliance instruction indicia is then provided on the second location.

While certain embodiments have been chosen to illustrate the invention, it will be understood that the invention is not limited to the embodiments shown and described herein.

What is claimed is:

1. An electrical system comprising an electrical wiring device and branch circuit breaker, said electrical wiring device comprising an outlet branch circuit arc fault circuit interrupter comprising:
    a housing having a front surface that is visible when viewed from a front of said housing during installation and in an installed position,
    a side surface having an inwardly extending shoulder parallel to said front surface and facing outwardly with respect to said outlet branch circuit arc fault circuit interrupter,
    and a rear surface; and
    printed indicia on said shoulder of said side surface of said housing, recessed from a front face of said housing to identify a location on said rear surface of said housing for printed installation instructions for said electrical wiring device and branch circuit breaker,
    said printed indicia being covered by a face plate after installation of said face plate onto said housing,
    said location said rear side of said housing having a surface area greater that a surface area of said shoulder; and
    printed installation instruction indicia provided on a label on said rear surface of said housing for installing said electrical wiring device and replacement of said branch circuit breaker,
    said rear surface having a surface area greater than a surface area of said shoulder, and where said printed installation instruction indicia occupies a surface area greater than a surface area of said shoulder,
    said label having a base sheet with an inner surface adhesively bonded to said rear surface, and outer sheet having a first edge fixed to a first edge of said base sheet and a second edge coupled to a second edge of said base sheet by a pressure sensitive adhesive,
    where said printed installation instruction indicia is provided on a top face of said base sheet and a bottom face of said outer sheet,
    and where said printed installation instruction indicia is accessible and visible by separating said outer sheet from said base sheet; and
    where said electrical system comprises a hang tag removably coupled to said housing, where said printed installation instruction indicia is provided on said hang tag.

2. The electrical system of claim 1, wherein said electrical wiring device is a kit comprising a combination of said outlet branch arc fault circuit interrupter and a molded case circuit breaker.

3. The electrical system of claim 1, wherein said printed indicia is visible when viewed during installation of said electrical wiring device and is in a location that can be covered by a cover plate.

4. The electrical system of claim 1, wherein said printed installation instruction indicia is attached to said rear face of said electrical wiring device.

5. An electrical system comprising an electrical wiring device and branch circuit breaker, said electrical wiring device consisting of an outlet branch circuit arc-fault circuit interrupter and a molded case circuit interrupter comprising:
   a housing supporting electrical wiring components and configured for mounting in an electrical box by a mounting strap,
   said housing having front cover with a front outer surface visible when viewed from said outer surface during installation and in an installed position,
   said housing having an inwardly extending shoulder parallel to said front outer surface and facing outwardly with respect to said outlet branch circuit arc fault circuit interrupter,
   said front outer surface having a plurality of blade openings for receiving a plug and at least one opening receiving a test button,
   said front cover having a side surface,
   and said housing having a rear body with a rear surface and a side wall coupled to said front cover;
   printed indicia on said shoulder of said side surface of said housing, recessed from a front face of said housing to identify a location on said rear surface of said housing for printed installation instructions for said electrical wiring device and branch circuit breaker,
   said printed indicia being oriented to be visible during installation of said electrical wiring device,
   and oriented to be covered by a faceplate after installation of the face plate; and
   printed installation instruction indicia provided on a label on said rear surface on said rear body of said housing for installing said electrical wiring device and replacement of the branch circuit breaker in the electrical system,
   said installation instruction indicia oriented on said rear surface or side wall of said rear body to be visible by an installer during installation of said electrical wiring device in the electrical system,
   and where said rear surface has a surface area greater than a surface area of said shoulder;
   and said printed installation instructions occupy a surface area greater than the surface area of said shoulder.
   said label having a base sheet with an inner surface adhesively bonded to said rear surface, and outer sheet having a first edge fixed to a first edge of said base sheet and a second edge coupled to a second edge of said base sheet by a pressure sensitive adhesive,
   where said printed installation instruction indicia is provided on a top face of said base sheet and a bottom face of said outer sheet,
   and where said printed installation instruction indicia is accessible and visible by separating said outer sheet from said base sheet; and
   where said electrical system comprises a hang tag removably coupled to said housing, where said printed installation instruction indicia is provided on said hang tag.

6. The electrical system of claim 5, wherein
   said electrical wiring device is a kit comprising a combination of said outlet branch arc fault circuit interrupter and a molded case circuit breaker.

7. The electrical system of claim 5, wherein said printed installation instruction indicia are attached to said rear face of said housing of said electrical wiring device.

8. The electrical system of claim 5, wherein said hang tag is removably coupled to said housing on said mounting strap or said side wall of said rear body.

9. A method for providing printed compliance instruction indicia on an electrical system comprising an electrical wiring device and branch circuit breaker, said electrical wiring device comprising an outlet branch circuit arc fault circuit interrupter comprising the steps of:
   providing said electrical wiring device consisting of an outlet branch circuit arc-fault circuit interrupter and a molded case circuit interrupter,
   said electrical wiring device having housing with a front outer surface that is visible when viewed from said front outer surface during installation in an installed position,
   a side surface,
   and a rear surface,
   said housing having an inwardly extending shoulder parallel to said front outer surface and facing outwardly with respect to said outlet branch circuit arc fault circuit interrupter;
   forming indicia on said shoulder of said side surface of said housing, recessed from a front face of said housing to identify a location that is visible to an installer during installation of said electrical wiring device, said indicia directing the installer to compliance installation instruction indicia on said housing; and
   providing the compliance installation instruction indicia on said rear surface of said housing for installing the electrical wiring device and replacement of the branch circuit breaker in the electrical system,
   where said rear surface has a surface area greater than a surface area of said shoulder;
   and said compliance installation instructions occupy a surface area greater than the surface area of said shoulder.
   said label having a base sheet with an inner surface adhesively bonded to said rear surface, and outer sheet having a first edge fixed to a first edge of said base sheet and a second edge coupled to a second edge of said base sheet by a pressure sensitive adhesive,
   where said compliance installation instruction indicia is provided on a top face of said base sheet and a bottom face of said outer sheet,
   and where said compliance installation instruction indicia is accessible and visible by separating said outer sheet from said base sheet; and
   where said electrical system comprises a hang tag removably coupled to said housing, where said compliance installation instruction indicia is provided on said hang tag.

10. The method of claim 9, wherein said compliance installation instruction indicia is provided on said hang tag that is removably coupled to said housing of said electrical wiring device.

* * * * *